US007137081B2

(12) United States Patent
Alpert et al.

(10) Patent No.: US 7,137,081 B2
(45) Date of Patent: Nov. 14, 2006

(54) METHOD AND APPARATUS FOR PERFORMING DENSITY-BIASED BUFFER INSERTION IN AN INTEGRATED CIRCUIT DESIGN

(75) Inventors: Charles Jay Alpert, Round Rock, TX (US); Milos Hrkic, Princeton, NJ (US); Stephen Thomas Quay, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 317 days.

(21) Appl. No.: 10/738,714

(22) Filed: Dec. 17, 2003

(65) Prior Publication Data

US 2005/0138589 A1 Jun. 23, 2005

(51) Int. Cl.
*G06F 17/50* (2006.01)
(52) U.S. Cl. ............... 716/2; 716/6; 716/10; 716/13; 716/15
(58) Field of Classification Search ............... 716/6, 716/10, 13–15
See application file for complete search history.

(56) References Cited

U.S. PATENT DOCUMENTS

| 6,314,547 | B1 * | 11/2001 | Donath et al. ............... 716/8 |
| 6,401,234 | B1 * | 6/2002 | Alpert et al. ............... 716/13 |
| 6,487,697 | B1 * | 11/2002 | Lu et al. ............... 716/2 |
| 6,819,538 | B1 | 12/2003 | Alpert et al. |
| 6,678,871 | B1 * | 1/2004 | Takeyama et al. ............... 716/6 |
| 6,725,438 | B1 * | 4/2004 | van Ginneken ............... 716/10 |
| 6,898,774 | B1 | 5/2005 | Alpert et al. |
| 6,925,624 | B1 * | 8/2005 | Komoda ............... 716/10 |
| 6,996,512 | B1 | 2/2006 | Alpert et al. |
| 7,062,743 | B1 * | 6/2006 | Kahng et al. ............... 716/13 |

| 2002/0184607 | A1 * | 12/2002 | Alpert et al. ............... 716/15 |
| 2004/0216072 | A1 * | 10/2004 | Alpert et al. ............... 716/13 |

OTHER PUBLICATIONS

Liu et al., "An efficient buffer insertion algorithm for large networks based on Lagrangian relaxation", Oct. 10-13, 1999, Computer Design, 1999. (ICCD '99) International Conference on, pp. 210-215.*
Lu et al., "Interconnect planning with local area constrained retiming logic IC layout", 2003, Design, Automation and Test in Europe Conference and Exhibition, pp. 442-447.*
Zhou et al, "Simultaneous Routing and Buffer Insertion with Restrictions on Buffer Location", IEEE Transaction on Computer Aided Design of Integrated Circuits and Systems, vol. 19, No. 7, Jul. 2000, pp. 819-824.

(Continued)

*Primary Examiner*—Stacy A. Whitmore
(74) *Attorney, Agent, or Firm*—Duke W. Yee; Casimer K. Salys; Wayne P. Bailey

(57) ABSTRACT

A method, apparatus, and computer program product for performing density biased buffer insertion in an integrated circuit design are provided. A tiled Steiner tree topology map is used in which density values are associated with each tile in the map. A directed acyclic graph (DAG) is created over an initial set of potential candidate points. A subset of the candidate points is selected by associating costs with each tile, and with each path or edge, to each tile. The total costs associated with placement of a buffer at a position within each tile are calculated. The lowest cost tile is then selected as a candidate position for buffer insertion. This process is then repeated to obtain an asymmetrically distributed set of candidate buffer insertion points between a source and a sink.

6 Claims, 9 Drawing Sheets

OTHER PUBLICATIONS

Gupta et al, "The Elmore Delay as a Bound for RC Trees with Generalized Input Signals", IEEE Transactions on Computer-Aided Design of Integrated Circuits and Systems, vol. 16, No. 1, Jan. 1997, pp. 95-104.

Cong et al., "Routing Tree Construction Under Fixed Buffer Locations", ACM Digital Library, 2000, pp. 379-384.

Tang et al., "A New Algorithm for Routing Tree Construction with Buffer Insertion and Wire Sizing Under Obstacle Constraints", University of Texas at Austin, Austin, TX, IEEE, 2001, pp. 49-56.

Jagannathan et al., "A Fast Algorithm for Context-Aware Buffer Insertion", ACM Digital Library, 2000, pp. 368-373, Dec. 7, 2003.

Cormen et al., "Interval Trees", Introduction to Algorithms, MIT Press, 2001, pp. 311-316, Dec. 7, 2003.

Hrkic et al., "Buffer Tree Synthesis with Consideration of Temporal Locality, Sink Polarity Requirements, Solution Cost and Blockages", University of Illinois at Chicago, CS Dept., Chicago, IL 60607, ISPD 2002, pp. 98-103, Dec. 7, 2003.

Hu et al., "Buffer Insertion with Adaptive Blockage Avoidance", ISPD 2002, San Diego, CA, USA, pp. 92-97.

Hrkic et al., "S-Tree: A Technique for Buffered Routing Tree Synthesis", University of Illinois at Chicago, CS Dept., Chicago, IL 60607, DAC 2002, pp. 578-583, Dec. 7, 2003.

Donath et al., "Transformational Placement and Synthesis", International Business Machines Corporation, Abstract, 8 pages, 2003.

Hrkic et al., "Buffer Tree Synthesis With Consideration of Temporal Locality, Sink Polarity Requirements, Solution Cost, Congestion, and Blockages", IEEE Transactions on Computer-Aided Design of Integrated Circuits and Systems, vol. 22, No. 4, Apr. 2003, pp. 481-491.

Alpert et al., "Porosity-Aware Buffered Steiner Tree Construction", IEEE Transactions on Computer-Aided Design of Integrated Circuits and Systems, vol. 23, No. 4, Apr. 2004, pp. 517-526.

Sze et al., "A Place and Route Aware Buffered Steiner Tree Construction", IEEE, 2004, pp. 355-498.

Alpert et al., "Steiner Tree Optimization for Buffers, Blockages, and Bays", IEEE Transactions on Computer-Aided Design of Integrated Circuits and Systems, vol. 20, No. 4, Apr. 2001, pp. 556-562.

Alpert et al., "Buffered Steiner Trees for Difficult Instances", International Symposium on Physical Design, Apr. 2001, pp. 4-8.

Alpert et al., "Wire Segmenting for Improved Buffer Insertion", IEEE/ACM DAC, 1997, pp. 588-593.

Alpert et al., "Buffer Insertion for Noise and Delay Optimization", IEEE/ACM DAC, 1998, pp. 362-367.

Alpert et al., "Buffer Insertion with Accurate Gate and Interconnect Delay Computation", IEEE/ACM DAC, 1999, pp. 479-484.

Alpert et al., "Porosity Aware Buffered Steiner Tree Construction", International Symposium on Physical Design, Apr. 2003, pp. 158-165.

Lai et al., "Maze Routing with Buffer Insertion and Wiresizing", IEEE/ACM DAC, 2000, pp. 374-378.

Lillis et al., "New Performance Driven Routing Techniques with Explicit Area/Delay Tradeoff and Simultaneous Wire Sizing", 33th IEEE/ACM DAC, 1996, pp. 395-400.

Lillis et al., "Optimal Wire Sizing and Buffer Insertion for Low Power and a Generalized Delay Model", IEEE Journal of Solid-State Circuits, vol. 31, No. 3, Mar. 1996, pp. 437-447.

Lillis et al., "Simultaneous Routing and Buffer Insertion for High Performance Interconnect", Sixth Great Lakes Symposium on VLSI, 1996, pp. 148-153.

Okamoto et al., "Buffer Steiner Tree Construction with Wire Sizing for Internconnect Layout Optimization", IEEE/ACM Int. Conf. Computer-Aided Design, 1996, pp. 44-49.

van Ginneken, "Buffer Placement in Distributed RC-tree Networks for Minimal Elmore Delay", Intl. Symposium on Circuits and Systems, 1990, pp. 865-868.

Alpert et al., "Buffered Steiner Trees for Difficult Instances", IEEE Transactions on Computer-Aided Design of Integrated Circuits and Systems, vol. 21, No. 1, Jan. 2002, pp. 3-14.

Alpert et al., "A Practical Methodology for Early Buffer and Wire Resource Allocation", IEEE/ACM DAC, 2001, pp. 189-195.

Cormen et al., "Introduction to Algorithms, Second Edition", MIT Press, 2001, pp. 549-552.

Cong, "Challenges and Opportunities for Design Innovations in Nanometer Technologies", SRC Working Papers, Dec. 1997, pp. 1-15.

Cong et al., "Buffer Block Planning for Interconnect-Driven Floorplanning", IEEE/ACM Intl. Conf. on Computer-Aided Design, 1999, pp. 358-363.

Dhar et al., "Optimum Buffer Circuits for Driving Long Uniform Lines", IEEE Journal of Solid-State Circuits, vol. 26, No. 1, Jan. 1991, pp. 32-40.

Gao et al., "A Graph Based Algorithm for Optimal Buffer Insertion Under Accurate Delay Models", Design Automation and Test in Europe, 2001, pp. 535-539.

Saxena et al., "The Scaling Challenge: Can Correct-by-Construction Design Help?", Proc. Intl. Symposium on Physical Design, 2003, pp. 51-58.

Shi et al., "An O(nlogn) Time Algorithm for Optimal Buffer Insertion", IEEE/ACM DAC, 2003, pp. 580-585.

10.4 Downhill Simplex Method in Multidimensions, Chapter 10 Minimization or Maximization of Functions, Numerical Recipes in C: the Art of Scientific Computing, Copyright 1998-1992, pp. 408-412.

Bhola et al., "Exactly-once Delivery in a Content-based Publish-Subscribe System", Proc. of the Intl Conf. on Dependable Systems and Networks, 2002 IEEE, 10 pages.

Corana et al., "Minimizing Multimodal Functions of Continuous Variables with the "Simulated Annealing" Algorithm", ACM Transactions on Mathematical Software, vol. 13, No. 3, Sep. 1987, pp. 262-280.

Barton et al., "Modifications of the Nelder-Mead Simplex Method for Stochastic Simulation Response Optimization", Proc of the 1991 Winter Simulation Conf., pp. 945-953.

Swisher et al., "A Survey of Simulation Optimization Techniques and Procedures", Proc of the 2000 Winter Simulation Conf., pp. 119-128.

Stewart et al., "An Optimization Framework for Web Farm Configuration", 2002 ACM, Rome, Italy, pp. 294-301.

Humphrey et al., "A Revised Simplex Search Procedure for Stochastic Simulation Response-Surface Optimization", Proc of the 1998 Winter Simulation Conf., pp.751-759.

Hooke et al., "'Direct Search' Solution of Numerical and Statistical Problems", Westinghouse Research Laboratories, Pittsburg, PA, USA, Oct. 1960, pp. 212-229.

Lewis et al., "Direct Search Methods: Then and Now", Dept. of Mathematics, College of William & Mary, Williamsburg, VA, pp. 1-16, 2003.

* cited by examiner

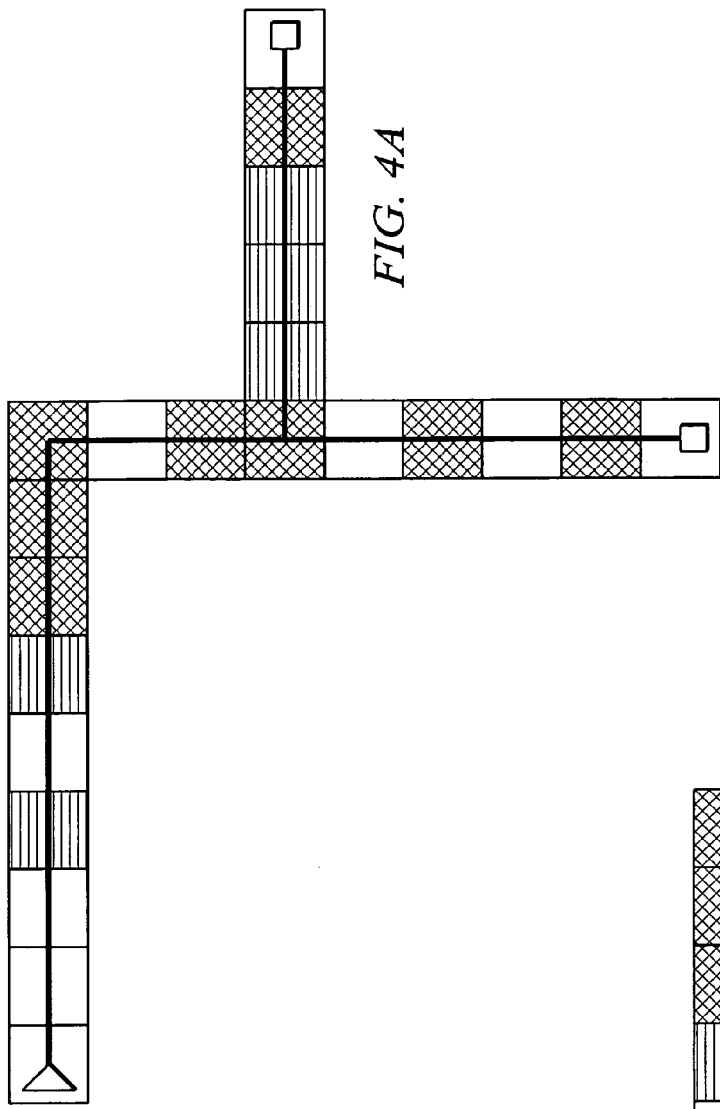
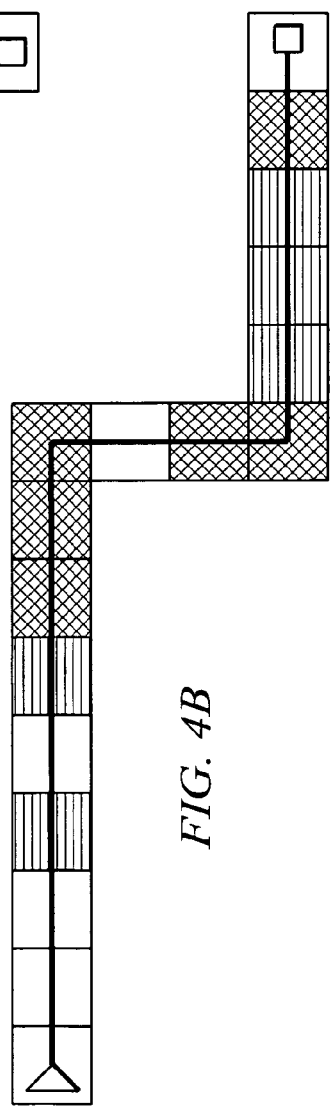
FIG. 4A
FIG. 4B

METHOD AND APPARATUS FOR PERFORMING DENSITY-BIASED BUFFER INSERTION IN AN INTEGRATED CIRCUIT DESIGN

BACKGROUND OF THE INVENTION

1. Technical Field

The present invention is directed to an improved method and apparatus for performing buffer insertion into an integrated circuit design. More specifically, the present invention is directed to a buffer insertion technique for efficiently locating candidate buffer insertion locations and managing logic design density within an integrated circuit, wherein the candidate buffer insertion locations are biased based on the relative density of one candidate location to other candidate locations.

2. Description of Related Art

It is now widely accepted that interconnect performance is becoming increasingly dominant over transistor and logic performance in the deep submicron regime. Buffer insertion is now a fundamental technology used in modern integrated circuit design methodologies. As gate delays decrease with increasing chip dimensions, however, the number of buffers required quickly rises. It is expected that close to 800,000 buffers will be required for 50 nanometer technologies. Thus, it is critical to automate the entire interconnect optimization process to efficiently achieve timing closure.

In addition to timing issues, managing the density of an integrated circuit design is becoming more problematic. The performance of a design highly depends on how packed the logic is geographically in the physical integrated circuit. If the logic is completely spread out, the design is routable but the performance suffers significantly. On the other hand, if the logic is packed, the design is not routable but would yield the best timing characteristics. A packed design is unsuitable for later design changes, such as the insertion of additional logic, such as a synthesized clock tree, since there is no room for the new logic.

Physical synthesis is now prominent in the automated design of blocks for use in high performance processors and Application Specific Integrated Circuits (ASICs). Physical synthesis is the process of concurrently optimizing placement, timing, power consumption, crosstalk effects, and the like, in an integrated circuit design. Physical synthesis helps to eliminate iterations between synthesis and place-and-route. Physical synthesis has the ability to repower gates, insert buffers, clone gates, and the like. Hence, the area of logic in the design remains fluid.

During physical synthesis, buffer insertion is called for to either optimize nets for delay or to fix nets due to electrical violations. One mechanism for performing buffer insertion on a fixed Steiner integrated circuit topology is the van Ginneken algorithm. Van Ginneken's dynamic programming algorithm, described in "Buffer Placement in Distributed RC-tree Networks for Minimal Elmore Delay," Int'l Symposium on Circuits and Systems, 1990, pp. 865–868, which is hereby incorporated by reference, has become a classic in the field. Given a fixed Steiner tree topology, the van Ginneken algorithm finds the optimal buffer placement on the topology under an Elmore delay model for a single buffer type and simple gate delay model. The primary idea of van Ginneken is to choose a set of buffer candidate locations that lie on the Steiner topology at some uniformly fixed distance apart. Buffer insertion then proceeds for that particular set of candidates from sink to source.

One problem with the van Ginneken approach to buffer insertion is that buffers are inserted at uniformly placed points along a net. That is, there is no consideration for the density of the logic in the vicinity of the candidate point. Thus, buffers may be inserted into regions that are very densely packed with logic or into regions that are sparsely populated with logic, depending on the particular uniform spacing of the candidate points.

Thus, it would be beneficial to have a method and apparatus for performing density-biased buffer insertion in the design of an integrated circuit.

SUMMARY OF THE INVENTION

The present invention provides a method, apparatus, and computer program product for performing density biased buffer insertion in an integrated circuit design. The present invention makes use of a tiled Steiner tree topology map in which density values are associated with each tile in the map. That is, tiles of a uniform area are used to segment the entire Steiner tree integrated circuit topology. Based on the design, an amount of the tile area that is occupied by logic may be determined. The ratio of occupied area to total area of the tile gives a measure of the density of the tile.

Given the tiled Steiner tree topology map and the density values of the tiles, the apparatus, method and computer program product of the present invention iteratively seeks out the placement of a next candidate point for buffer insertion on the net such that low density tiles are preferred of higher density tiles so long as the impact on performance is minimized.

In order to identify candidate points for buffer insertion, a directed acyclic graph (DAG) is created over an initial set of potential candidate points. The DAG is a graph whose edges, i.e. connections between two vertices, are ordered pairs of vertexes where no path, i.e. a list of vertices of a graph where each vertex has an edge from it to the next vertex, starts and ends at the same vertex.

A subset of the candidate points is selected by constructing a shortest path via a topological sort. In order to construct the shortest path via a topological sort, costs are associated with each tile and with each path or edge to each tile. In a preferred embodiment, the costs associated with each tile are based on the density of the tile. The costs associated with the path or edge are based on a ratio of the desired distance between candidate points as input by a user or obtained from a traditional van Ginneken approach to buffer insertion, to a difference between the desired distance between the candidate points and the actual distance to the particular tile.

The total costs associated with placement of a buffer at a position within each tile up to a maximum distance, e.g., the desired distance between candidate points, from a current position are calculated. The lowest cost tile is then selected as a candidate position for buffer insertion. This process is then repeated with the recently selected candidate position being the origin of the next iteration of selection of a candidate position. Thus, an asymmetrically distributed set of candidate buffer insertion points between a source and a sink is compiled iteratively using the above approach.

These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 4A is an exemplary diagram of a portion of an integrated circuit which has been segmented into tiled regions;

FIG. 4B is an exemplary diagram of a 2-path in the portion of the integrated circuit illustrated in FIG. 4A;

DETAILED DESCRIPTION OF THE PREFERRED EMBODIMENT

Figure 1:
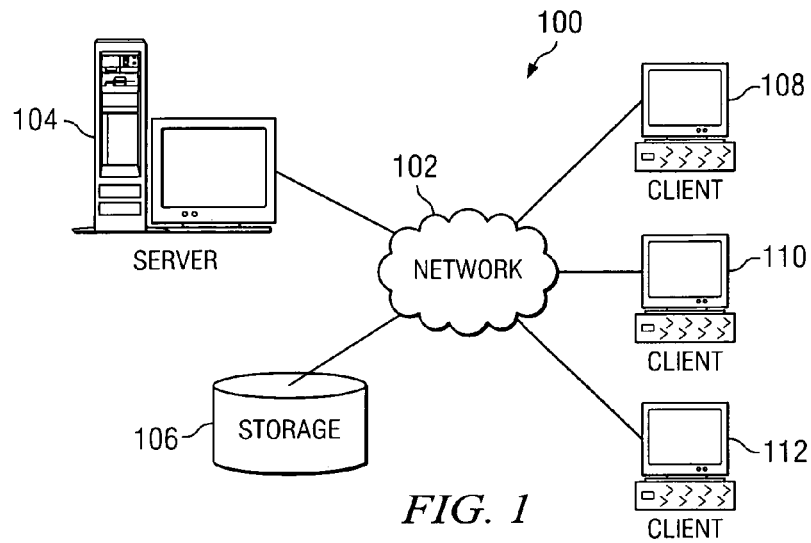
FIG. 1 is an exemplary pictorial representation which depicts a network of data processing systems in accordance with the present invention.
Figure 2:
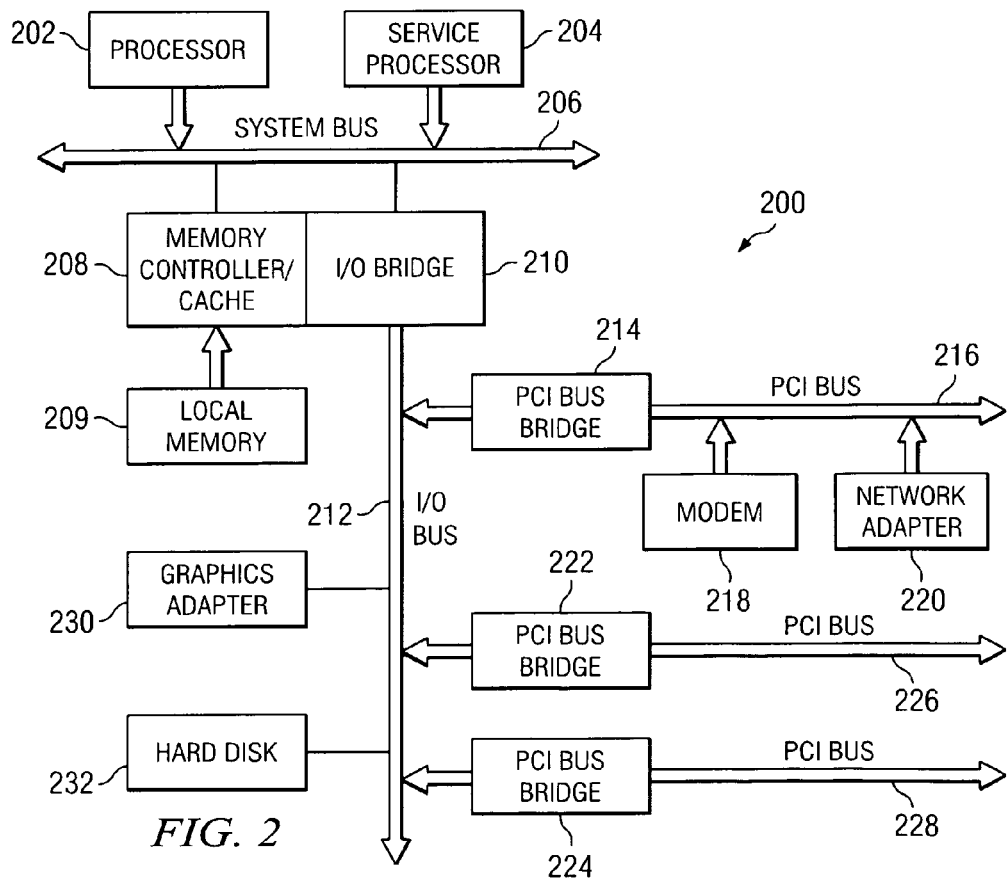
FIG. 2 is a more detailed exemplary illustration of a computer system that may be used to implement a stand-alone computing system or any of the computer systems of FIG. 1 in accordance with the present invention.

The present invention provides a method, apparatus and computer program product for performing density-biased buffer insertion in an integrated circuit design. As such, the present invention is preferably implemented in a data processing device. The data processing device may be a stand-alone computing device or may be a distributed data processing system in which multiple computing devices are utilized to perform various aspects of the present invention. Therefore, the following FIGS. 1 and 2 are provided as exemplary diagrams of data processing environments in which the present invention may be implemented. It should be appreciated that FIGS. 1 and 2 are only exemplary and are not intended to assert or imply any limitation with regard to the environments in which the present invention may be implemented. Many modifications to the depicted environments may be made without departing from the spirit and scope of the present invention.

With reference now to the figures, FIG. 1 is an exemplary pictorial representation of a network of data processing systems in which the present invention may be implemented. Network data processing system 100 is a network of computers in which the present invention may be implemented. Network data processing system 100 contains a network 102, which is the medium used to provide communications links between various devices and computers connected together within network data processing system 100. Network 102 may include connections, such as wire, wireless communication links, or fiber optic cables.

In the depicted example, a server 104 is connected to network 102 along with storage unit 106. In addition, clients 108, 110, and 112 also are connected to network 102. These clients 108, 110, and 112 may be, for example, personal computers, network computers, or other computing devices. In the depicted example, server 104 provides data, such as boot files, operating system images, and applications to clients 108–112. Clients 108, 110, and 112 are clients to server 104. Network data processing system 100 may include additional servers, clients, and other devices not shown. In the depicted example, network data processing system 100 is the Internet with network 102 representing a worldwide collection of networks and gateways that use the TCP/IP suite of protocols to communicate with one another. At the heart of the Internet is a backbone of high-speed data communication lines between major nodes or host computers, consisting of thousands of commercial, government, educational and other computer systems that route data and messages. Of course, network data processing system 100 also may be implemented as a number of different types of networks, such as for example, an intranet, a local area network (LAN), a wide area network (WAN), or a wireless network. FIG. 1 is intended as an example, and not as an architectural limitation for the present invention.

FIG. 2 is a more detailed exemplary illustration of a stand-alone computer system or a computer system that may be used to implement any of the computer systems of FIG. 1 in accordance with the present invention. Data processing system 200 may be a symmetric multiprocessor (SMP) system including a plurality of processors 202 and 204 connected to system bus 206. Alternatively, a single processor system may be employed.

In the depicted example, processor 204 is a service processor. Also connected to system bus 206 is memory controller/cache 208, which provides an interface to local memory 209. I/O bus bridge 210 is connected to system bus 206 and provides an interface to I/O bus 212. Memory controller/cache 208 and I/O bus bridge 210 may be integrated as depicted.

Peripheral component interconnect (PCI) bus bridge 214 connected to I/O bus 212 provides an interface to PCI local bus 216. A number of modems may be connected to PCI bus 216. Typical PCI bus implementations will support four PCI expansion slots or add-in connectors. Communications links to network computers 108–112 in FIG. 1 may be provided through modem 218 and network adapter 220 connected to PCI local bus 216 through add-in boards.

Additional PCI bus bridges 222 and 224 provide interfaces for additional PCI buses 226 and 228, from which additional modems or network adapters may be supported. In this manner, data processing system 200 allows connections to multiple network computers. A memory-mapped graphics adapter 230 and hard disk 232 may also be connected to I/O bus 212 as depicted, either directly or indirectly.

Service processor 204 interrogates system processors, memory components, and I/O bridges to generate an inventory and topology understanding of data processing system 200. Service processor 204 also executes Built-In-Self-Tests (BISTs), Basic Assurance Tests (BATs), and memory tests on all elements found by interrogating a system processor, memory controller, and I/O bridge. Any error information for failures detected during the BISTs, BATs, and memory tests are gathered and reported by service processor 204.

Those of ordinary skill in the art will appreciate that the hardware depicted in FIG. 2 may vary. For example, other peripheral devices, such as optical disk drives and the like, also may be used in addition to or in place of the hardware depicted. The depicted example is not meant to imply architectural limitations with respect to the present invention.

As mentioned above, the present invention provides a mechanism for performing density-biased buffer insertion of an integrated circuit design. Design density is a very important consideration when deciding where to insert buffers.

For example, in hierarchical designs, limited space is allocated for buffer usage. These spaces are either alleys in-between blocks or special purpose blocks, referred to herein as "buffer blocks", that are designated to hold only buffers. During buffer insertion, if an alley or a buffer block is filled up too early in the physical synthesis process, critical space resources may not be available when trying to buffer a critical net. Even for flat designs, design density management is increasingly important simply due to the large number of buffers that are required.

As mentioned previously, the van Ginneken dynamic programming algorithm is the most famous and widely used buffer insertion algorithm. The van Ginneken algorithm finds the optimal slack solution for a given net and a fixed topology. When the van Ginneken algorithm is utilized, a set of uniformly spaced buffer insertion candidate locations are selected for the given topology. When a candidate location falls within a region that is blocked because it is too densely populated with logic, that location is skipped and a buffer is inserted into the next candidate insertion location that is not blocked while maintaining the uniform spacing. This is illustrated in FIG. 3A.

Figure 3A:
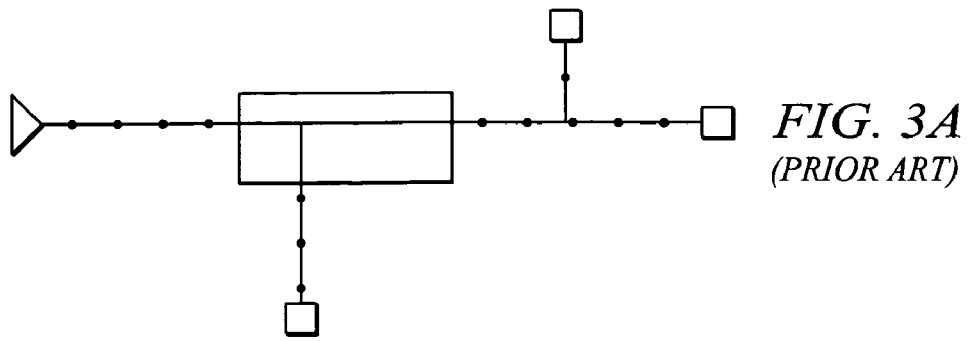
FIGS. 3A–3C illustrate the difference between candidate buffer insertion point selection of the present invention and candidate buffer insertion point selection typically obtained through a known van Ginneken algorithm.

As shown in FIG. 3A, candidate buffer insertion points are placed at regular intervals along the path from source A, to sinks B, C and D of the Steiner tree representation of the net. A logic cell E, or a portion of a logic cell E, is present in the path of the net. The portion of the net that is blocked by this logic cell E is skipped when determining candidate buffer insertion points.

Figure 3B:
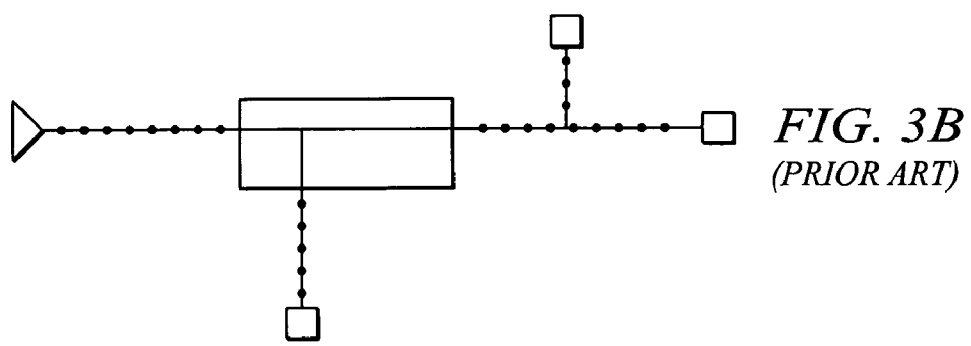

The spacing between candidate buffer insertion points may be increased or reduced in accordance with the desires of the designer in order to achieve a particular timing requirement. FIG. 3B illustrates a van Ginneken buffer insertion solution in which the spacing between candidate buffer insertion points is reduced such that more candidate buffer insertion points are present. The additional buffer insertion locations in FIG. 3B could potentially improve the timing for the buffered net, for additional runtime cost.

Figure 3C:
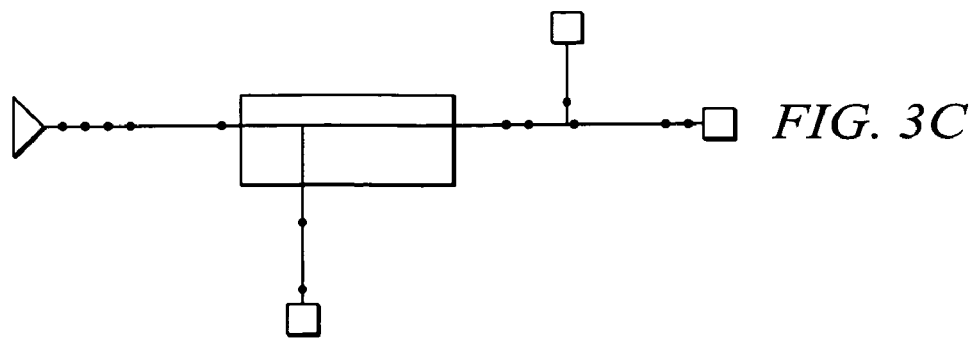

FIG. 3C represents candidate buffer insertion points obtained using the present invention. As shown in FIG. 3C, roughly the same number of buffer insertion candidates are utilized as in the uniform spacing van Ginneken algorithm, however the spacing is asymmetrical. The purpose of the asymmetrical spacing of the buffer insertion points is not to improve timing performance, but rather to bias the locations at which buffers are inserted to favor regions of the design that are determined to be more favorable, such as areas with lower density.

To accomplish this asymmetrically spaced candidate buffer insertion point selection, a linear time and linear memory shortest path mechanism has been devised. The mechanism constructs a directed acyclic graph (DAG) over a set of potential candidate locations and chooses a subset of the candidate locations by constructing a shortest path via a topological sort. For virtually no additional processor cost, e.g. CPU cycles, or timing penalty, the mechanism of the present invention identifies candidate locations that cause van Ginneken's algorithm to significantly improve design density management.

The present invention makes use of a tiled Steiner tree topology map in which density values are associated with each tile in the map. The generation of a tiled Steiner tree topology map is described in, for example, commonly assigned U.S. Pat. No. 6,996,512 B1 entitled "Practical Methodology for Early Buffer and Wire Resource Allocation," issued on Feb. 7, 2006, which is hereby incorporated by reference. The tile graph offers both a complexity reduction advantage (especially when there are thousands of buffer sites) and also the ability to manage routing congestion across tile boundaries. The granularity of the tiling depends on the desired accuracy/runtime trade-off and on the current stage in the design flow. In one exemplary embodiment of the present invention, the tiles are of fine a size that the exact location of the buffer within the tile does not significantly affect the path's timing.

Having obtained a tiled Steiner tree topology map, a cost is associated with each tile of the tiled Steiner tree topology map. This cost is representative of the preferences for inserting buffers in certain parts of the chip. The cost function used to calculate the costs for the tiles may take many different forms and may be based on various characteristics of the integrated circuit design. For example, the cost may be based on such characteristics as a tile's via density, total power usage, area density, routing congestion or variability, and/or the like.

In a preferred embodiment, the cost associated with a tile is determined based on how densely populated the tile is. The density of the tile may be determined, for example, by a ratio of the amount of area of the tile covered by logic cells, or portions of logic cells, to the total area of the tile.

FIG. 4A is an exemplary diagram of a portion of an integrated circuit represented as a Steiner tree which has been segmented into tiled regions. The lighter shaded tiles represent relatively low cost areas of the integrated circuit design, while darker shaded tiles represent relatively higher cost areas of the integrated circuit design. Again, it should be appreciated that the "cost" may be based on various characteristics of the integrated circuit or combinations of characteristics of the integrated circuit. However, in a preferred embodiment of the present invention, the cost will be based on a measure of the density of the tile, i.e. how much area of the tile is occupied by logic cells or other integrated circuit components.

The present invention seeks to select a subset of the tiles, which correspond to buffer insertion locations, which provide an optimum placement for the buffers while biasing this selection based on the costs associated with the tiles and costs associated with a deviation of the path to these tiles from a selected or ideal symmetrical spacing solution.

Referring again to FIG. 4A, the problem that is sought to be solved by the present invention may be formulated in the following manner. Let T be the set of tiles that overlap the given Steiner tree (i.e. the tiles illustrated in FIG. 4A) and let $P \subseteq T$ be a set of tiles corresponding to chosen buffer insertion locations. Let $dist(t_i, t_j)$ be the number of tiles on the path from $t_i$ to $t_j$ in T. For example, $dist(D, C)$ in FIG. 4A would be equal to 5.

Let L be the maximum allowable tiles between consecutive buffers. L may be determined, for example, based on the maximum allowable slew constraint, by determining the ideal buffer spacing for delay (such as in the traditional van Ginneken approach), or the like. Preferably, L should be a value where, if buffers are placed at a distance greater than L tiles away from each other, either an electrical violation results or performance is significantly sacrificed.

With the above values, the problem to be solved by the present invention may be formulated as follows:

$$\text{Find } P \subseteq T \text{ that minimizes } \sum_{t \in P} cst(t) \text{ such that} \quad (1)$$

$$dist(t_i, t_j) \leq L$$

where t is the tile, P is a buffer insertion tile location, and cst(t) is the cost associated with tile t.

One problem with solving this formulation is that it serves to minimize the total number of buffer insertion candidates. Using a uniform spacing of distance L between candidate buffer insertion locations does not give van Ginneken's algorithm much flexibility to decouple branches and utilize buffers of different sizes. Empirically, one needs to space candidate locations at a distance of around L/6 to obtain high quality solutions.

The present invention provides more flexibility to the van Ginneken algorithm by providing a mechanism for associating penalty values, or costs, with deviations from the ideal spacing between candidate buffer insertion locations. These penalty values, along with the penalty values, or costs, associated with the tiles themselves, are utilized to determine the optimum candidate buffer insertion location in the tiled Steiner tree map of the net. As a result, a listing of candidate buffer insertion locations may be generated that have asymmetrical spacing between the candidate buffer insertion locations.

The mechanism of the present invention may be formulated in the following manner. Let S be the desired or ideal number of tiles between consecutive buffer insertion candidates. S is chosen in order to obtain the desired timing performance/CPU tradeoff. For example, the spacing between candidate buffer insertion points in FIG. 3A is twice that of FIG. 3B. The result is that van Ginneken's algorithm will take longer to run on the example shown in FIG. 3B, yet it may achieve a better solution than the example shown in FIG. 3A.

Given a subset of tiles $P \subseteq T$, let $C(P) \subseteq P \times P$ be the set of consecutive pairs of tiles in P. If P is constructed with uniform tile spacing S, then $dist(t_i, t_j) = S$ for all $(t_i, t_j) \in C(P)$ (except for potentially next to the sinks).

For asymmetric spacing, a penalty is associated with spacing tiles either closer to or further from the desired spacing S. A penalty function is defined as pen(x,S,L) that assigns a cost penalty when the distance x between tiles is not equal to S. The complete problem formulation is now:

Given a set of tiles T that overlap a given Steiner tree for a net, a maximum buffer spacing L, and a desired spacing S, find $P \subseteq T$ that minimizes:

$$\sum_{t \in P} cst(t) + \sum_{(t_i,t_j) \in C(P)} pen(dist(t_i, t_j), S, L) \text{ such that} \quad (2)$$

$$dist(t_i, t_j) \leq L.$$

In order to obtain a solution to the above problem, the present invention operates on sets of disjoint 2-paths within the tiled Steiner tree map of the integrated circuit design. A 2-path is a route in which the endpoints of the route are either sinks, Steiner points, i.e. additional points that are not sources or sinks, that are introduced to reduce the length of the Steiner tree, or a source. Thus, the tiled Steiner tree map shown in FIG. 4A has the following 2-paths A to D, D to B, and D to C. These 2-paths are illustrated in FIG. 4B.

If the above formulated problem were solved "optimally" without breaking the Steiner tree into 2-paths, it is not guaranteed that an optimal solution to the problem is formulated. The reason the solution may be suboptimal is due to candidate buffer insertion point spacing near Steiner points. However, in these cases, one actually should seek candidate locations that are on branches of the Steiner tree that immediately follow Steiner points in order to give van Ginneken's algorithm decoupling opportunities. Hence, the present invention breaks the Steiner tree into 2-paths and solves each problem separately to yield higher quality solutions.

As mentioned above, each tile has an associated cost that is representative of the desirability of inserting a buffer into the tile. This cost may be based on various characteristics of the integrated circuit design. However, for purposes of illustration, it will be assumed that the costs associated with the tiles are a function of density of the tile. The density d(t) of the tile t is calculated as the ratio of the logic cell area inside the tile to the total available area within the tile.

If D is defined as the density of a full tile, i.e. a tile that has been completely filled with a logic cell, the value of D may be set to a predetermined value, such as 1.00. However, in order to permit enough space in each tile for the insertion of a buffer, it may be desirable to set the value of D to be less than 1.00, such as D=0.96. The choice of D may also be dependent on the tile size. That is, if the tiles have a large area, a higher value of D may be selected. If the tiles have a small area, a smaller value of D may be selected.

A formulation for the cost function is selected for determining the costs associated with each tile. This formulation may take many different forms. In a preferred embodiment of the present invention, the cost function is formulated as $cst(t)=d(t)^2$ for $d(t)<D$ and $cst(t)=\infty$ otherwise. Assigning infinite cost for full tiles ensures that the tile will not be selected as a candidate for buffer insertion. Using squared cost ensures that the cost increases more rapidly as a tile is closer to becoming full. For example, the cost of choosing two tiles with densities of 0.1 and 0.9 is 0.82, while the cost of choosing two tiles with density of 0.5 is 0.5. Of course other cost functions, such as $d(t)^3$, may be used without departing from the spirit and scope of the present invention.

In addition to determining a cost for each tile based on the density of the tile, the present invention uses a penalty or cost function to be associated with the spacing between tiles being considered as candidate buffer insertion points. As with the cost formulation for each tile, the cost function associated with the spacing may take many different forms and may be based on various characteristics of the integrated circuit design. In a preferred embodiment, the cost or penalty is based on a desired or ideal spacing S, an actual spacing x, and a maximum spacing L. In one exemplary embodiment, the cost or penalty function may be the following quadratic function:

$$pen(x,S,L)=(x-S)^2/(L-S)^2 \quad (3)$$

From the above function, it is clear that if the actual spacing x is equal to the ideal spacing S, then there is no penalty of cost associated with the spacing. The maximum penalty is one since $x \leq L$ (as long as $S \leq L/2$, which is normally necessary to achieve good solutions). The penalty or cost due to spacing increased quadratically with the distance from the desired spacing since delay also increases proportionally to length. In practice, one can also add a scaling constant to trade off between the first and second terms in equation (2) to obtain either looser or tighter adherence to the desired spacing.

Of course other penalty functions may be defined to represent the costs associated with delay due to changes in length of the spacing between candidate buffer insertion points. For example, in later depicted examples, a penalty or cost function of $pen(x, S)=(x-S)^2/S^2$ will be utilized. The particular selection of penalty or cost functions for both the tiles themselves and the spacing of candidate buffer insertion points is dependent upon the particular implementation of the present invention.

Having determined the cost or penalty functions to be used for assigning a cost to each tile based on its density, and determining a cost of spacing between candidate buffer insertion points, the present invention involves performing an iterative identification or sort of candidate buffer insertion points from a starting point of a 2-path to an ending point of a 2-path in the tiled Steiner tree map of the integrated circuit.

That is, given a single 2-path, the set of tiles that the 2-path spans are labeled as $t_1 \ldots t_n$. A directed acyclic graph (DAG) GT(V,E) is constructed where the vertices V are $V=\{t_1 \ldots t_n\}$ and the endpoints E are $E=\{(t_i, t_j)\}$ for all i and j such that $i<j$, $j-i \leq L$, $cst(t_i) \neq \infty$, and $cost(t_j) \neq \infty$. The edges in E connect tiles within the distance constraint as long as neither tile has infinite cost. Note that $G^T$ is a DAG and that $|E|<nL$.

The set of candidate buffer insertion points in the DAG can be realized by performing a shortest path computation on $G^T$. The shortest path on a DAG can be efficiently computed via a topological sort. That is, let $c_i$ be the cost of the best solution from $t_1$ to $t_i$ and let $P_i$ be the path corresponding to that solution. The tiles visited on the path $P_n$ correspond to the solution for the 2-path T.

For example, a DAG $G^T$ may be constructed from a given path of tiles T, i.e. $G^T(V, E)$ is constructed from T. The cost of the solution at the first tile is initialized to zero and its corresponding path is initialized to the empty set, i.e. $c_1=0$ and $P_1=\emptyset$. Thereafter, for each tile after the first tile up to the nth tile in the 2-path, the cost associated with the tile is set to $\infty$.

The operation then loops through each edge that goes from an earlier tile $t_i$ to a later tile $t_j$ and calculates the cost value of constructing a path to $t_j$ from $t_i$ based on the established cost or penalty functions discussed above. A determination is made as to whether this calculated cost value is less than the best cost value calculated previously. If it is smaller, the cost $c_j$ and path Pj are updated accordingly. Finally, the path to the last tile is returned. It should be noted that if $c_n=\infty$, no solution exists that satisfies the constraints. This operation may be summarized in the following algorithm:

1. Construct $G^T$ (V,E) from T
2. Set $c_1=0$ and $P_1=\emptyset$
3. for j=2 to n do
4.    Set $c_j=\infty$
5.    for each edge $(t_i,t_j) \in E$ do
6.       set tmp=$c_i$+cst($t_j$)+pen(j−i,S,L)

-continued 7.       if tmp<$c_j$ then
           set $c_j$=tmp, $P_j=P_i \cup \{t_j\}$
8. Return Pn where the inputs to the algorithm are the set of tiles $T=\{t_1, \ldots, t_n\}$ in the 2-path, the maximum tile spacing constraint L, and the desired spacing S between buffer candidates. The variables in the above algorithm are the cost $c_i$ of optimal solution from $t_1$ to $t_i$, the set of tiles $P_i$ for the solution from $t_1$ to $t_i$, the cost tmp of the current sub-path, and the DAG $G^T(V, E)$ constructed from T. The output of the above algorithm is the set of tiles $P \subseteq T$ for candidate buffer insertion points.

The algorithm runs in O(nL) time, which is linear time, given that T is a constant. The runtime is dominated by the O(n) loop in Step 3 above, which calls the O(L) loop in Step 5. Note that because the graph is a DAG, one does not need the more expensive Dijkstra algorithm since a topological sort is sufficient. Further, the memory requirement is only O(n) since only one cost value need be stored for each tile. The paths do not have to be stored explicitly, but may be stored implicitly by pointers back to the previous tile. Then the final path can be uncovered by a tracing back along the pointers.

The operation of the present invention will now be described in terms of an exemplary 2-path of a tiled Steiner tree map of an integrated circuit design. The following examples will use the following equations for determining costs associated with the tiles based on their respective densities and costs associated with spacing or paths to these tiles based on a difference in the size of the spacing or path from the desired or ideal path size:

Tile cost $cst(t)=density^2=d(t)^2$; and

Edge or path cost $pen(x,S,L)=(x-S)^2/S^2$ where x is the actual spacing, S is the desired or ideal spacing, and t is the tile. It will also be considered that the maximum spacing is equal to the desired spacing, i.e. L=S.

Figure 5:
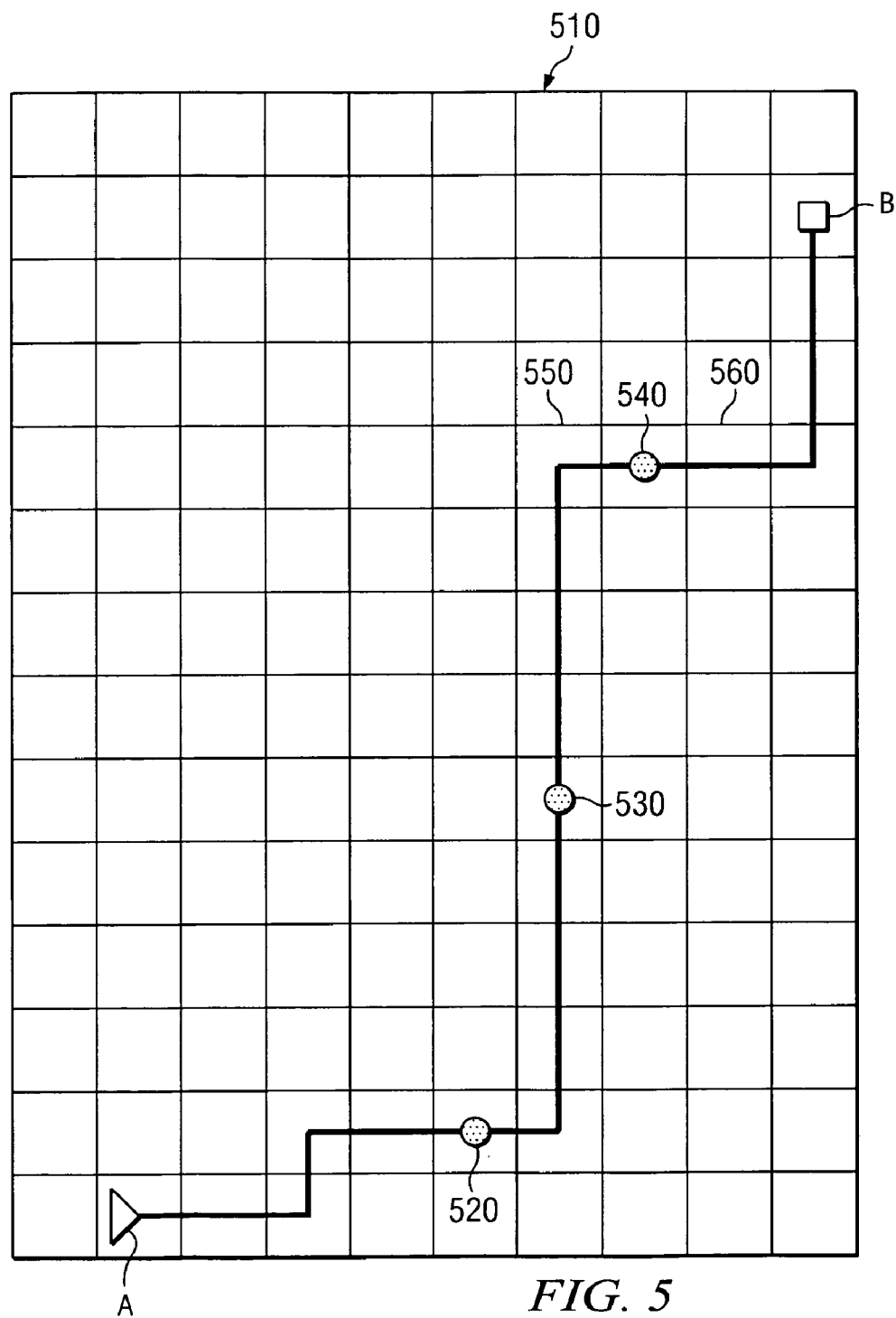
FIG. 5 is an exemplary diagram of a portion of an integrated circuit with symmetrically spaced candidate buffer insertion points illustrated.

FIG. 5 is an exemplary diagram of the portion of the integrated circuit with traditional van Ginneken candidate buffer insertion points illustrated. In the depicted example, the symmetrical spacing of the candidate buffer insertion points is illustrated with an ideal spacing of 5 tiles within the tiled Steiner tree map 510. The candidate buffer insertion points are shown as darkened circles 520–540 on the net between the source A and the sink B.

As mentioned earlier, the symmetrical spacing used in a traditional van Ginneken approach to buffer insertion, such as that depicted, does not account for the densities of the tiles in which the candidate buffer insertion points are located. Thus, for example, candidate buffer insertion point 540 may be present in a tile that is quite densely occupied by logic cells while the neighboring tiles 550 and 560 may be less densely occupied and would be better candidates for buffer insertion.

Figure 6:
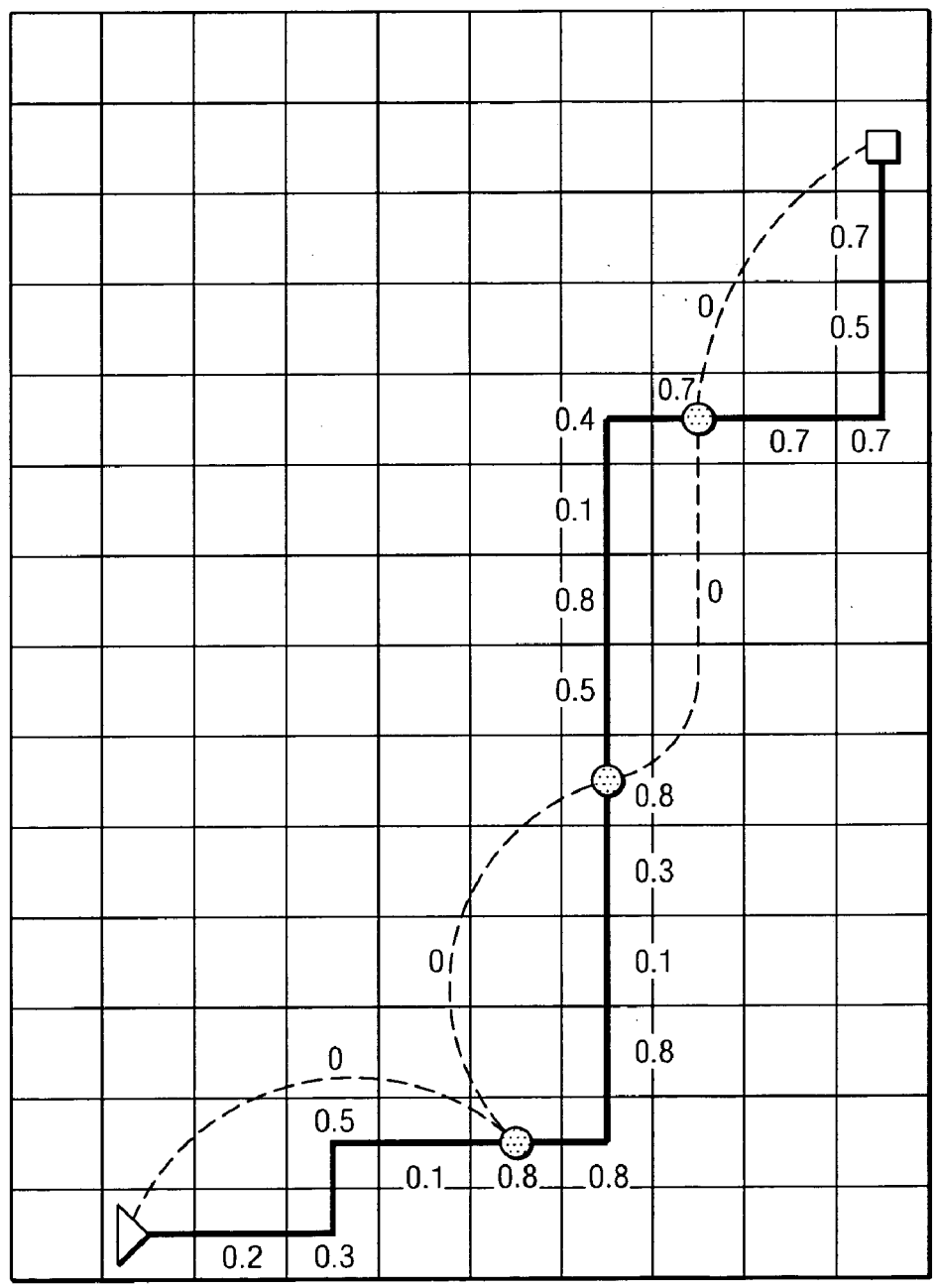
FIG. 6 is an exemplary diagram of the portion of the integrated circuit shown in FIG. 5 with density costs associated with each tile in accordance with the present invention.

FIG. 6 is an exemplary diagram of the portion of the integrated circuit shown in FIG. 5 with density values associated with each tile in accordance with the present invention. As discussed above, the present invention involves associating costs with tiles that overlap the Steiner tree. In a preferred embodiment, these costs are based on the density of the associated tile. The density value for a tile may be obtained by calculating the ratio of an area of a logic cell present within the tile to the total area of the tile. Exemplary density values are illustrated in FIG. 6. From these density values, it can be determined which tiles are more densely populated with logic cells than others.

The present invention seeks to identify tiles between a current tile, which may be a start of the 2-path net, or a current candidate buffer insertion point, and a tile that is spaced at a maximum spacing away from the current tile, that minimizes a total cost calculation that is based on the cost associated with the tile and a cost associated with a deviation of the spacing from a desired or ideal spacing. In so doing, the cost function for determining the cost associated with the spacing if formulated in such a way that the cost associated with symmetrical spacing at the desired or ideal spacing interval is set to 0. This is illustrated by the dashed lines in FIG. 6.

FIGS. 7A–7E are exemplary diagrams of the portion of the integrated circuit illustrated in FIG. 6 with the iterative selection of candidate buffer insertion points illustrated in accordance with the present invention. Having determined a manner by which to obtain a cost valuation for each tile based on its density, and a cost valuation for deviations of spacing from a desired or ideal spacing, the present invention iteratively generates cost values for each tile from a current tile to a maximumly spaced tile from the current tile. The least total cost tile is then selected as a candidate for buffer insertion and is added to a list of candidate buffer insertion tiles.

Figures 7A, 7B:
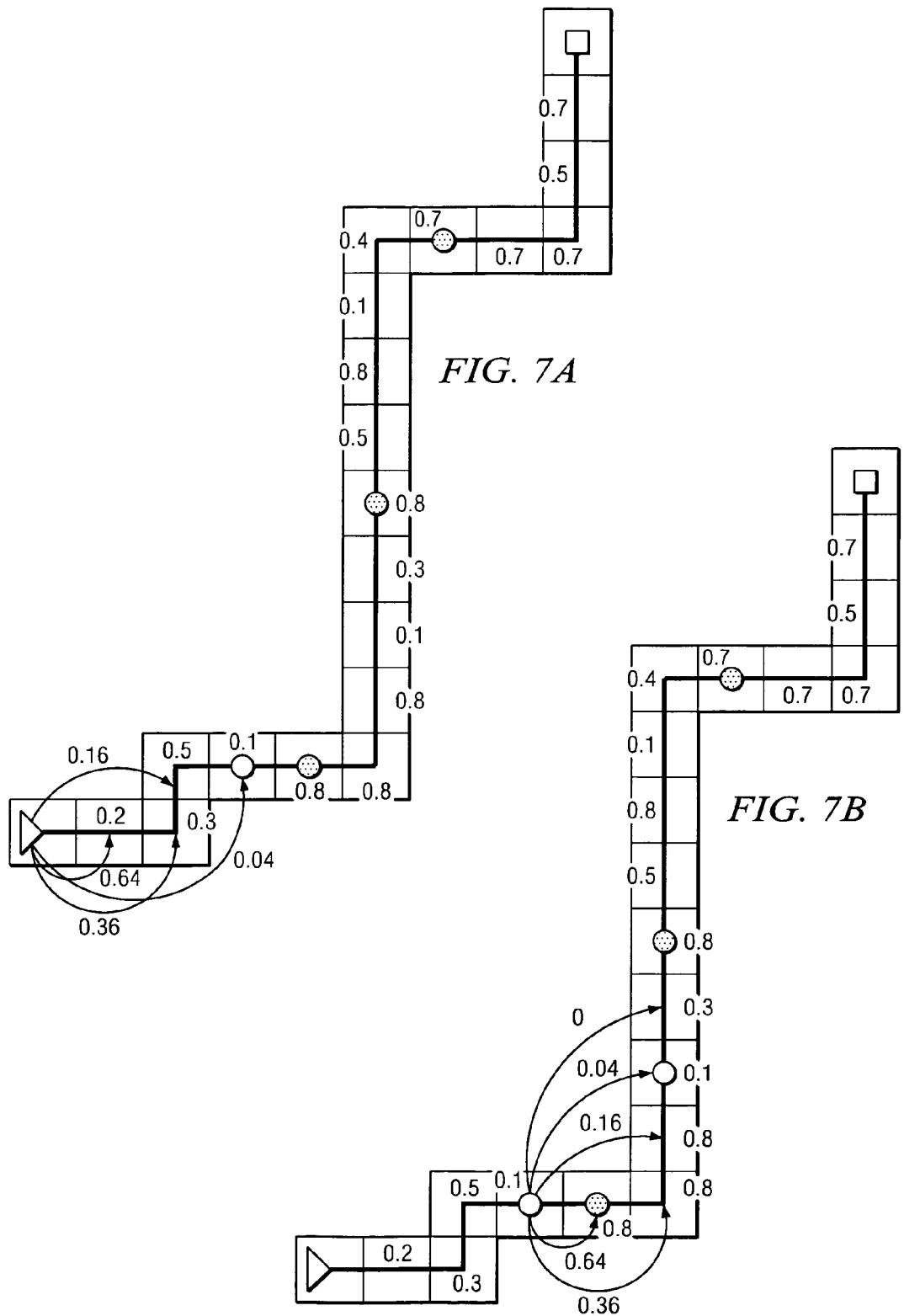
FIGS. 7A–7E are exemplary diagrams of the portion of the integrated circuit illustrated in FIG. 6 with the iterative selection of candidate buffer insertion points illustrated in accordance with the present invention.

As shown in FIG. 7A, the costs of the tiles between a current tile $t0$ and a maximumly spaced tile $t5$ are 0.04, 0.09, 0.25 and 0.01, respectively. These costs may be obtained in accordance with the cost function described above, i.e. $cst(t)=density^2$. For each tile $t1$ to $t5$, the cost or penalty function for the path to that tile from $t0$ is calculated and added to the cost associated with the tile. Thus, for example, the penalty for the path to tile $t1$ is calculated as $(1-5)^2/5^2 = 16/25$ or 0.64. Thus, the total cost for placement of a buffer in tile $t1$ is 0.68. Similar costs may be calculated for the other tiles $t2$ to $t5$ with the results being 0.45, 0.41, 0.05 and 0.8, respectively. Thus, from these cost values, it is clear that the least cost solution for buffer insertion is tile $t4$ with a total cost of 0.05. This cost value takes into consideration the density of the tile and the affect on timing due to a deviation from the desired or ideal spacing value.

Figures 7C, 7D:
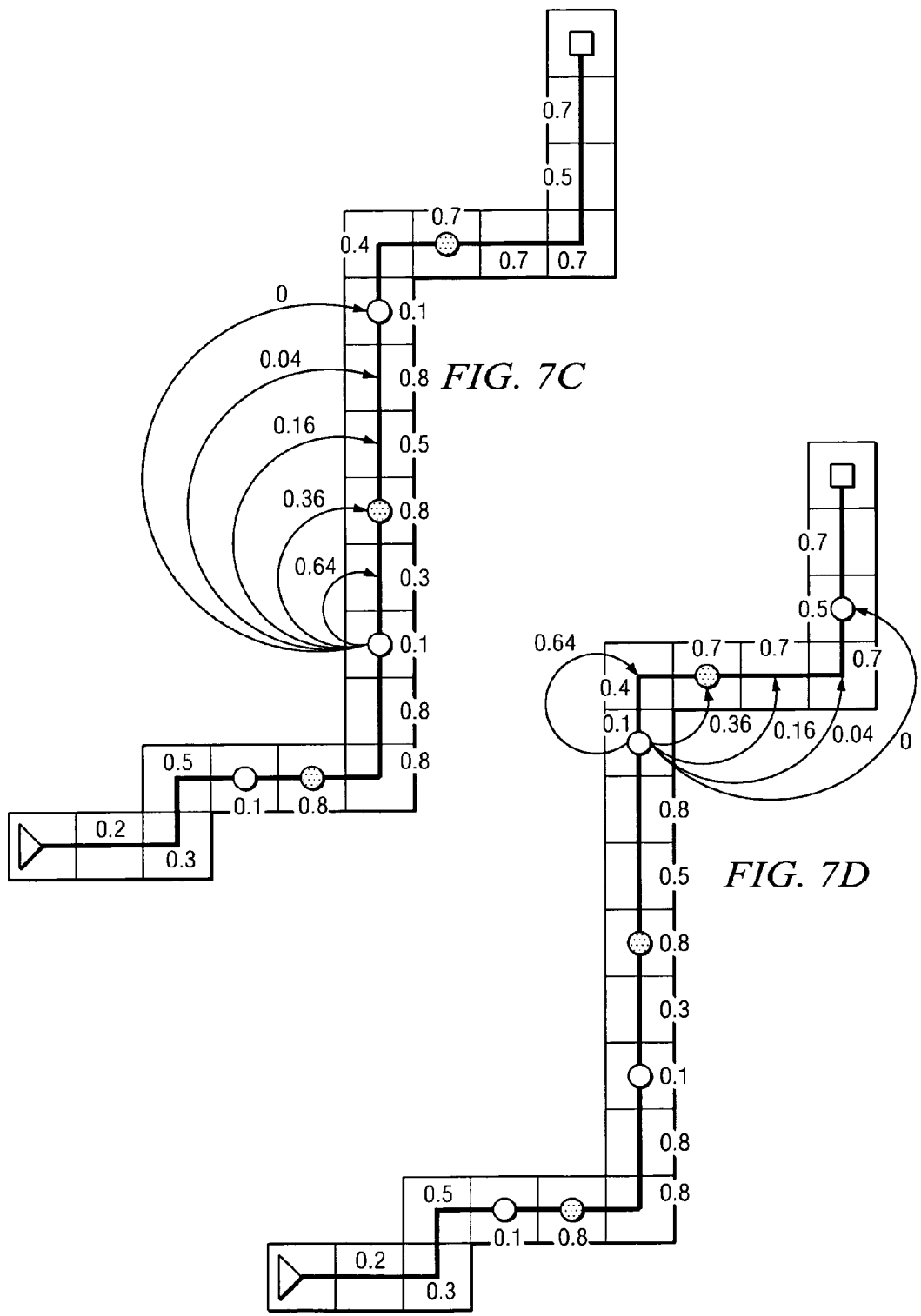

The tile $t4$ is thus identified as a candidate for buffer insertion (denoted by the non-filled circle on the net in FIG. 7A) and is added to a candidate buffer insertion point set or list. The current tile is then reset to the identified candidate buffer insertion point, i.e. tile $t4$, and the process is repeated in order to identify the next candidate buffer insertion point. The subsequent iterations of the above methodology are shown in FIGS. 7B–7D.

As shown in FIG. 7B, from the calculation of total costs for the tiles $t6$ to $t10$, the tile $t9$ is selected as the optimum choice for buffer insertion. Thus, $t9$ is added to the candidate-buffer insertion points set or list and the current tile is reset to $t9$. The process continues in FIG. 7C where tile $t13$ is selected as a candidate buffer insertion point and FIG. 7D where tile $t18$ is selected as a candidate buffer insertion point. Since the distance between the candidate buffer insertion point and the end of the 2-path is less than the maximum spacing, the operation terminates.

Figure 7E:
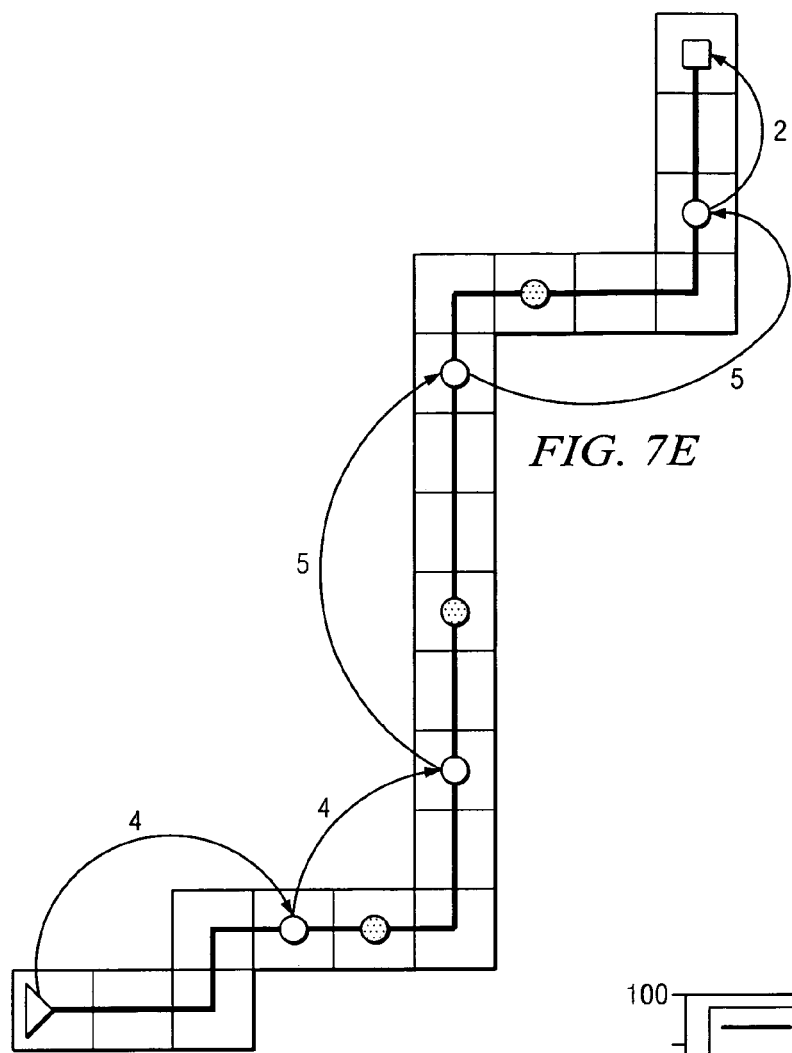

The result of the above approach to identifying candidate buffer insertion points is illustrated in FIG. 7E where the number of tiles between candidate buffer insertion points is illustrated on the curve lines representing the paths between candidate buffer insertion points. As shown, from the source to the first candidate buffer insertion point, the spacing is 4 tiles, from the first candidate buffer insertion point to the second candidate buffer insertion point the spacing is 4, from the second candidate buffer insertion point to the third candidate buffer insertion point the spacing is 5, from the third candidate buffer insertion point to the fourth candidate buffer insertion point the spacing is 5, and from the fourth candidate buffer insertion point to the sink the spacing is 2. Thus, an asymmetrical spacing of candidate buffer insertion points is obtained from the operation of the present invention. This asymmetrical spacing takes into consideration the densities of the tiles and the penalties associated with deviating from a desired or ideal spacing.

The above process may be repeated for each 2-path of the tiled Steiner tree map of the integrated circuit design. In this way, optimum buffer insertion points are identified for an entire integrated circuit design while taking into account the density of the integrated circuit design and the affects on timing due to changes in placement of buffers in the integrated circuit design from an uniform buffer insertion methodology.

The above methodology has been implemented in a data processing device that operates on ASIC designs. Both a uniform spacing approach, such as the traditional van Ginneken approach, denoted as UNI, and an asymmetrical spacing approach according to the present invention, denoted as SPA, were applied to 1000 of the largest nets from an industrial ASIC design with about 340,000 instances. For this experiment, the ASIC design was broken into 330 tiles on a side and the following values were utilized: S=5 tiles and L=35 tiles with equations (2) and (3) being used to obtain the costs associated with placement of buffers in tiles.

For the 1000 nets, UNI inserted 5900 buffers while SPA inserted 5804 buffers. Every time a buffer was inserted, the density of the tile in which the buffer was place was recorded. The distribution of all of the buffer insertions as a function of the tile densities is shown in Table 1 below.

TABLE 1

Distribution of Buffers of UNI and SPA as a Function of Density for 1000 Large Nets

| Density | UNI | SPA |
| --- | --- | --- |
| 0–4 | 0 | 0 |
| 5–9 | 160 | 347 |
| 10–14 | 221 | 567 |
| 15–19 | 245 | 553 |
| 20–24 | 220 | 479 |
| 25–29 | 193 | 389 |
| 30–34 | 223 | 372 |
| 35–39 | 253 | 335 |
| 40–44 | 274 | 325 |
| 45–49 | 275 | 280 |
| 50–54 | 405 | 302 |
| 55–59 | 462 | 301 |
| 60–64 | 333 | 231 |
| 65–69 | 318 | 186 |
| 70–74 | 445 | 265 |
| 75–79 | 513 | 263 |
| 80–84 | 440 | 213 |
| 85–89 | 404 | 181 |
| 90–94 | 435 | 181 |
| 95–99 | 81 | 34 |

For example, for tiles with density between 10% and 14.99%, UNI inserted 221 buffers while SPA inserted 567. For tiles with density between 90% and 94.99%, UNI inserted 435 buffers while SPA inserted only 181 buffers. From the table, one can see that SPA was more successful at inserting buffers in tiles with lower density than UNI, with the crossover point being between 45% and 50%.

Figure 8:
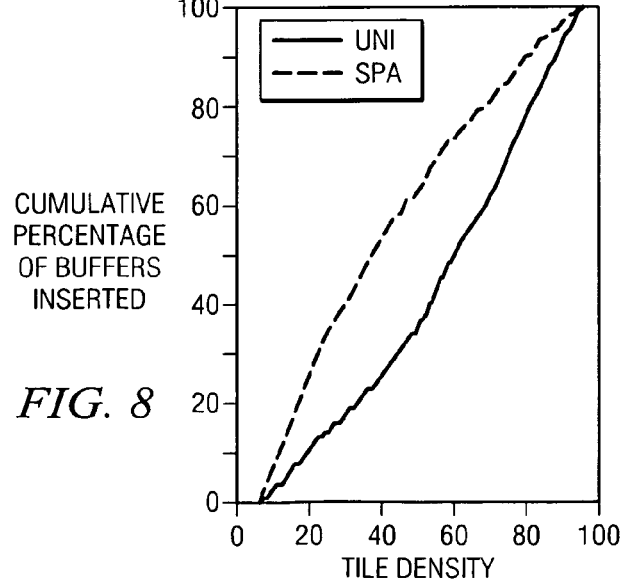
FIG. 8 is an exemplary plot illustrating the difference in cumulative percentage of buffers inserted at various tile densities for uniform distance buffer insertion and density-biased buffer insertion.

FIG. 8 is an exemplary plot illustrating the difference in cumulative percentage of buffers inserted at various tile densities for uniform distance buffer insertion and density-biased buffer insertion. FIG. 8 illustrates the distribution shown in Table 1 but in a different way. Instead of grouping the bin densities into 5% ranges as in Table 1, they are grouped in 1% bins, and the cumulative percent of buffers inserted into bins is measured. For example, looking at a tile density of 50% on the x-axis shows that the cumulative percentages for UNI and SPA are 36% and 63%, respectively. This means that 36% of the 5900 buffers that UNI inserted were in bins with density of 50% or less, while 63% of the 5804 buffers that were inserted by SPA were in bins with density of 50% or less. The further to the upper left that the curve lies, the better the job the corresponding algorithm does at density management.

While SPA does a better job than UNI at density management, virtual nothing is sacrificed in terms of runtime or quality of results. UNI improves the slack on average of 5.040 ns per net, versus 5.019 ns for SPA. This 21 ps difference is less than one percent of the average slack reduction.

In addition, the total runtime to select buffer candidate locations is just a fraction of the total time it takes to run the traditional van Ginneken algorithm. Since SPA is more selective of the potential buffer insertion candidates, this results in a total runtime of 278.7 seconds versus 1429.8 for UNI. Thus, SPA is over five times faster. Note that one could obtain a faster runtime for UNI by increasing S.

Figure 9:
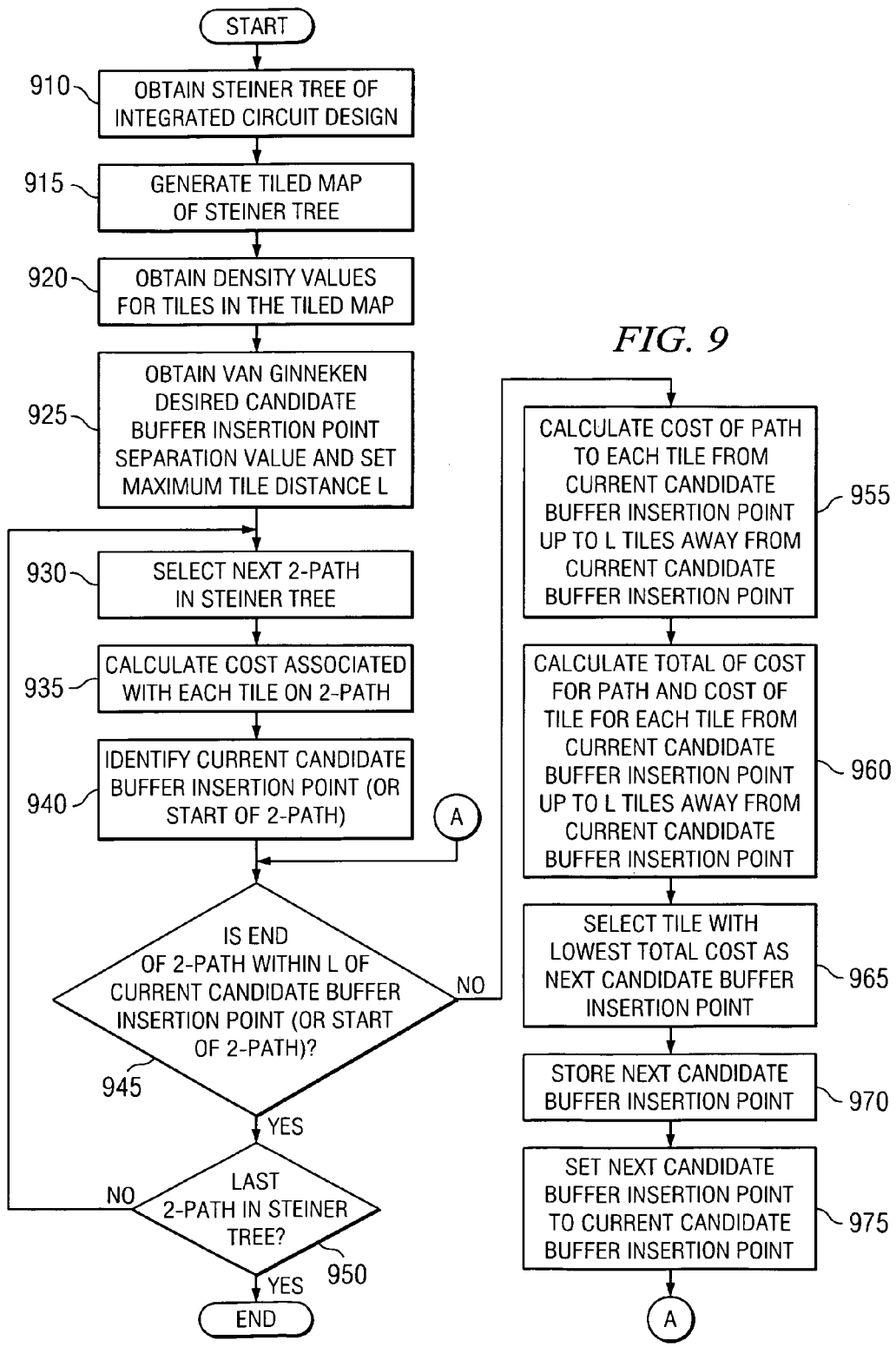
FIG. 9 is a flowchart outlining an exemplary operation of the present invention when selecting candidate buffer insertion points along a net based on density of tiles on the net.

FIG. 9 is a flowchart outlining an exemplary operation of the present invention when selecting candidate buffer insertion points along a net based on density of tiles on the net. It will be understood that each block of the flowchart illustration, and combinations of blocks in the flowchart illustration, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustration support combinations of means for performing the specified functions, combinations of steps for performing the specified functions and program instruction means for performing the specified functions. It will also be understood that each block of the flowchart illustration, and combinations of blocks in the flowchart illustration, can be implemented by special purpose hardware-based computer systems which perform the specified functions or steps, or by combinations of special purpose hardware and computer instructions.

As shown in FIG. 9, the operation starts by obtaining Steiner tree of the integrated circuit design (step 910). A tiled map of the Steiner tree is then generated (step 915) and density values for the tiles in the tiled map are computed (step 920). The desired or ideal candidate buffer insertion point separation value is obtained and the maximum tile distance is set (step 925).

A next 2-path in the Steiner tree is selected (step 930). The cost associated with each tile on the 2-path is then calculated (step 935) and a current candidate buffer insertion point, or start of the 2-path, is identified (step 940). A determination is then made as to whether the end of the 2-path is within the maximum distance of the current candidate buffer insertion point, or start of the 2-path (step 945).

If so, a determination is made as to whether this is the last 2-path in the Steiner tree (step 950). If so, the operation terminates. Otherwise, if this is not the last 2-path in the Steiner tree, the operation returns to step 930 and the next 2-path in the Steiner tree is selected.

If the end of the 2-path is not within the maximum tile distance of the current candidate buffer insertion point, or start of the 2-path, then a cost is calculated for the paths to each of the tiles from the current candidate buffer insertion point up to the maximum tile distance away from the current candidate buffer insertion point (step 955). A total cost is then calculated for each tile based on the cost associated with the tile and the cost of the path to the tile (step 960). A tile with the lowest total cost is selected as the next candidate buffer insertion point (step 965). The next candidate buffer insertion point is then stored (step 970), and the current candidate buffer insertion point is set to the next candidate buffer insertion point that was just identified (step 975). The operation then returns to step 945.

The resulting set of candidate buffer insertion points may be output for use in physical synthesis of the integrated circuit design. That is, the set of candidate buffer insertion points may be used to perform actual buffer insertion into the physical integrated circuit layout. In this way, an optimal buffer insertion solution is obtained.

Thus, the present invention provides an improved method, apparatus, and computer program product for identifying buffer insertion points in an integrated circuit design. The present invention provides better density management during buffer insertion than known methodologies and takes into account affects on timing attributable to deviations from desired or ideal spacing of buffers in the integrated circuit design. The present invention obtains an improved integrated circuit design with inserted buffers over known methodologies in a fraction of the runtime.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for selecting buffer insertion locations within an integrated circuit design, comprising:

obtaining a tiled directed acyclic graph (DAG) of a portion of the integrated circuit design, wherein the tiled DAG includes a plurality of tiles;

associating a first cost with each tile of the tiled DAG, wherein the first cost associated with a tile is based on a characteristic of the tile that is representative of suitability of the tile for buffer insertion;

selecting a subset of tiles from the plurality of tiles based on the first cost associated with each tile, wherein the subset of tiles are candidate buffer insertion tiles; and associating a second cost with paths to each tile of the tiled DAG, wherein the second cost associated with the paths to each tile is representative of a cost due to a deviation from a symmetric distribution of buffer insertion points, and wherein the subset of tiles are selected based on both the first cost associated with each tile and the second cost associated with paths to each tile, wherein the first cost is a first function of the area density of the tile, and wherein the second cost is a second function of a difference between a spacing of the tile from a previously selected candidate buffer insertion tile, and a symmetrical spacing from the previously selected candidate buffer insertion tile.

2. The method of claim 1, wherein second function is:

$$\text{pen}(x,S,L)=(x-S)^2/(L-S)^2$$

where pen(x, S, L) is the cost associated with the path to a tile t, x is the spacing of the tile from a previously selected candidate buffer insertion tile, S is the symmetrical spacing from the previously selected candidate buffer insertion tile, and L is a maximum spacing between the previously selected candidate buffer insertion tile and a next candidate buffer insertion tile.

3. The method of claim 1, wherein the first function is:

$$\text{cst}(t)=d(t)^n$$

where cst(t) is a cost representative of the suitability for buffer insertion of the tile t, d(t) is the area density of the tile t, and n is a selected power.

4. A computer program product comprised of set of instructions and stored in a computer readable medium, which when executed performs method steps for selecting buffer insertion locations within an integrated circuit design, comprising:

first instructions for obtaining a tiled directed acyclic graph (DAG) of a portion of the integrated circuit design, wherein the tiled DAG includes a plurality of tiles;

second instructions for associating a first cost with each tile of the tiled DAG, wherein the first cost associated with a tile is based on a characteristic of the tile that is representative of suitability of the tile for buffer insertion;

third instructions for selecting a subset of tiles from the plurality of tiles based on the first cost associated with each tile, wherein the subset of tiles are candidate buffer insertion tiles; and fourth instructions for associating a second cost with paths to each tile of the tiled DAG, wherein the second cost associated with the paths to each tile is representative of a cost due to a deviation from a symmetric distribution of buffer insertion points, and wherein the subset of tiles are selected based on both the first cost associated with each tile and the second cost associated with paths to each tile, wherein the first cost is a first function of the area density of the tile, and wherein the second cost is a second function of a difference between a spacing of the tile from a previously selected candidate buffer insertion tile, and a symmetrical spacing from the previously selected candidate buffer insertion tile.

5. The computer program product of claim 4, wherein second function is:

$$\text{pen}(x,S,L)=(x-S)^2(L-S)^2$$

where pen(x, S, L) is the cost associated with the path to a tile t, x is the spacing of the tile from a previously selected candidate buffer insertion tile, S is the symmetrical spacing from the previously selected candidate buffer insertion tile, and L is a maximum spacing between the previously selected candidate buffer insertion tile and a next candidate buffer insertion tile.

6. An apparatus for selecting buffer insertion locations within an integrated circuit design, comprising:

means for obtaining a tiled directed acyclic graph (DAG) of a portion of the integrated circuit design, wherein the tiled DAG includes a plurality of tiles;

means for associating a first cost with each tile of the tiled DAG, wherein the first cost associated with a tile is based on a characteristic of the tile that is representative of suitability of the tile for buffer insertion;

means for selecting a subset of tiles from the plurality of tiles based on the first cost associated with each tile, wherein the subset of tiles are candidate buffer insertion tiles; and means for associating a second cost with paths to each tile of the tiled DAG, wherein the second cost associated with the paths to each tile is representative of a cost due to a deviation from a symmetric distribution of buffer insertion points, and wherein the subset of tiles are selected based on both the first cost associated with each tile and the second cost associated with paths to each tile, wherein the first cost is a first function of the area density of the tile, and wherein the second cost is a second function of a difference between a spacing of the tile from a previously selected candidate buffer insertion tile, and a symmetrical spacing from the previously selected candidate buffer insertion tile.

* * * * *